(12) United States Patent
Kim et al.

(10) Patent No.: US 8,536,567 B2
(45) Date of Patent: Sep. 17, 2013

(54) ORGANIC LIGHT EMITTING DISPLAY AND FABRICATION METHOD THEREOF

(75) Inventors: Jongyun Kim, Yongin-si (KR); Byoungdeog Choi, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 106 days.

(21) Appl. No.: 11/785,099

(22) Filed: Apr. 13, 2007

(65) Prior Publication Data
US 2008/0111126 A1    May 15, 2008

(30) Foreign Application Priority Data

Nov. 10, 2006 (KR) .......................... 10-2006-0111298

(51) Int. Cl.
*H01L 35/24* (2006.01)

(52) U.S. Cl.
USPC ...... 257/40; 257/E51.005; 257/435; 257/436; 257/13

(58) Field of Classification Search
USPC .................................. 257/E51.005
See application file for complete search history.

(56) References Cited

U.S. PATENT DOCUMENTS

| | | | | |
|---|---|---|---|---|
| 4,735,847 | A * | 4/1988 | Fujiwara et al. | 428/209 |
| 5,504,605 | A | 4/1996 | Sakuma et al. | |
| 5,811,866 | A | 9/1998 | Hirata | |
| 5,986,401 | A | 11/1999 | Thompson et al. | |
| 6,559,594 | B2 | 5/2003 | Fukunaga et al. | |
| 6,597,113 | B1 | 7/2003 | Nitta | |
| 6,815,240 | B2 | 11/2004 | Hayashi | |
| 7,083,863 | B2 * | 8/2006 | Satou et al. | 428/690 |
| 7,223,636 | B2 | 5/2007 | Kobayashi et al. | |
| 7,276,291 | B2 * | 10/2007 | Bright | 428/458 |
| 2001/0011868 | A1 | 8/2001 | Fukunaga et al. | |
| 2002/0119585 | A1 * | 8/2002 | Yamazaki et al. | 438/29 |
| 2002/0134979 | A1 | 9/2002 | Yamazaki et al. | |
| 2003/0010062 | A1 | 1/2003 | Matthies | |
| 2003/0020124 | A1 | 1/2003 | Guenther | |
| 2003/0082889 | A1 * | 5/2003 | Maruyama et al. | 438/455 |

(Continued)

FOREIGN PATENT DOCUMENTS

| | | |
|---|---|---|
| CN | 1423513 | 6/2003 |
| CN | 1450837 | 10/2003 |

(Continued)

OTHER PUBLICATIONS

Avis relatif au rapport de recherche europeenne issued on Mar. 19, 2008 by the European EPO in the corresponding European Application of U.S. Appl. No. 11/785,043.

(Continued)

*Primary Examiner* — Julio J Maldonado
*Assistant Examiner* — Mohammad Choudhry
(74) *Attorney, Agent, or Firm* — Robert E. Bushnell, Esq.

(57) ABSTRACT

An organic light emitting display includes: a substrate, a buffer layer arranged on the substrate, a semiconductor layer arranged on the buffer layer, a gate insulating layer arranged on the semiconductor layer, a gate electrode arranged on the gate insulating layer, an inter-layer dielectric layer arranged on the gate electrode, a source/drain electrode arranged on the inter-layer dielectric layer, an insulating layer arranged on the source/drain electrode, an non-transmissive layer arranged on the insulating layer; and an organic light emitting diode arranged on the insulating layer.

27 Claims, 6 Drawing Sheets

(56) References Cited

U.S. PATENT DOCUMENTS

| | | | |
|---|---|---|---|
| 2003/0094894 A1* | 5/2003 | Andry et al. | 313/506 |
| 2003/0098645 A1 | 5/2003 | Lee et al. | |
| 2003/0104753 A1 | 6/2003 | Graff et al. | |
| 2003/0107326 A1 | 6/2003 | Park et al. | |
| 2003/0155860 A1 | 8/2003 | Choi et al. | |
| 2004/0129960 A1 | 7/2004 | Maruyama et al. | |
| 2004/0135148 A1 | 7/2004 | Lin | |
| 2004/0135164 A1 | 7/2004 | Park et al. | |
| 2004/0178723 A1 | 9/2004 | Yasukawa et al. | |
| 2004/0191963 A1 | 9/2004 | Pichler | |
| 2004/0251827 A1 | 12/2004 | Kang et al. | |
| 2004/0253838 A1 | 12/2004 | Yamazaki et al. | |
| 2004/0259283 A1 | 12/2004 | Koo et al. | |
| 2005/0002081 A1 | 1/2005 | Beteille et al. | |
| 2005/0029926 A1* | 2/2005 | Park et al. | 313/500 |
| 2005/0045917 A1 | 3/2005 | Yamazaki et al. | |
| 2005/0046340 A1 | 3/2005 | Kohara et al. | |
| 2005/0046783 A1 | 3/2005 | Kawata et al. | |
| 2005/0067945 A1 | 3/2005 | Nishikawa et al. | |
| 2005/0067950 A1* | 3/2005 | Nonoue et al. | 313/504 |
| 2005/0101052 A1 | 5/2005 | Kobayashi et al. | |
| 2005/0164470 A1 | 7/2005 | Yamazaki et al. | |
| 2005/0211990 A1 | 9/2005 | Lee et al. | |
| 2005/0218409 A1* | 10/2005 | Um et al. | 257/72 |
| 2005/0285522 A1 | 12/2005 | Han | |
| 2007/0048895 A1 | 3/2007 | Suginoya et al. | |
| 2008/0111125 A1 | 5/2008 | Kim | |
| 2008/0111126 A1 | 5/2008 | Kim et al. | |
| 2008/0111477 A1 | 5/2008 | Kim | |
| 2008/0128683 A1 | 6/2008 | Kim et al. | |
| 2008/0142791 A1 | 6/2008 | Kim et al. | |

FOREIGN PATENT DOCUMENTS

| | | |
|---|---|---|
| EP | 1482572 A1 | 12/2004 |
| EP | 1584971 A1 | 10/2005 |
| EP | 1596637 A1 | 11/2005 |
| JP | 198417810 B | 4/1984 |
| JP | 09211482 A | 8/1997 |
| JP | 10221700 | 8/1998 |
| JP | 2000-150145 A | 5/2000 |
| JP | 2000150145 | 5/2000 |
| JP | 2000268735 | 9/2000 |
| JP | 2000298264 A | 10/2000 |
| JP | 2001-053290 | 2/2001 |
| JP | 2001319776 | 11/2001 |
| JP | 2002350833 | 12/2002 |
| JP | 2003173872 A | 6/2003 |
| JP | 2003282235 | 10/2003 |
| JP | 2003317953 | 11/2003 |
| JP | 2004170910 | 6/2004 |
| JP | 2004205601 | 7/2004 |
| JP | 2005-085705 | 3/2005 |
| JP | 2005071693 | 3/2005 |
| JP | 2005183414 | 7/2005 |
| JP | 2005-222789 | 8/2005 |
| JP | 2005-222930 | 8/2005 |
| JP | 2005284252 | 10/2005 |
| JP | 2005-340011 A | 12/2005 |
| JP | 2005-340168 A | 12/2005 |
| JP | 2005-340182 | 12/2005 |
| JP | 2006-058814 A | 3/2006 |
| JP | 2006-270511 A | 10/2006 |
| JP | 2007122984 A | 5/2007 |
| JP | 2008141151 | 6/2008 |
| JP | 2005-222930 | 8/2008 |
| KR | 10-2003-0009913 | 2/2003 |
| KR | 20030054777 A | 7/2003 |
| KR | 20030069434 A | 8/2003 |
| KR | 20040010186 A | 1/2004 |
| KR | 20040106808 A | 12/2004 |
| KR | 20050012958 A | 2/2005 |
| KR | 20050029826 A | 3/2005 |
| KR | 10-2005-0051646 | 6/2005 |
| KR | 20050059259 A | 6/2005 |
| KR | 20050064352 A | 6/2005 |
| KR | 1020060089638 A | 8/2006 |
| KR | 20060099743 A | 9/2006 |
| KR | 20060124940 A | 12/2006 |
| KR | 20070014494 A | 2/2007 |
| KR | 20070047633 A | 5/2007 |
| WO | WO2004/075607 | 9/2004 |
| WO | 2005/093700 A2 | 10/2005 |

OTHER PUBLICATIONS

Office Action (Paper No. 20100724) mailed on Jul. 28, 2010 for U.S. Appl. No. 11/785,043.

Office Action (Paper No. 20100729) mailed on Aug. 4, 2010 for U.S. Appl. No. 11/785,098.

Office Action (Paper No. 20090522) mailed on May 28, 2009 for U.S. Appl. No. 11/785,098.

Office Action (Paper No. 20100717) mailed on Jul. 23, 2010 for U.S. Appl. No. 11/785,101.

Office Action (Paper No. 20080812) mailed on Aug. 21, 2008 for U.S. Appl. No. 11/785,044.

Office Action (Paper No. 20080613) mailed on Jul. 15, 2008 for U.S. Appl. No. 11/785,044.

Office Action (Paper No. 20080118) mailed on Jan. 22, 2008 for U.S. Appl. No. 11/785,044.

Office Action (Paper No. 20100314) mailed on Mar. 18, 2010 for U.S. Appl. No. 11/785,043.

European Extended Search Report issued on Nov. 2, 2010 in the European Application No. 07252164.4. (Cited in the IDS filed on Jan. 12, 2011 in the U.S. Appl. No. 11/785,101.).

Extended European Search Report dated Feb. 7, 2011 issued by the EPO for corresponding Korean Patent Application No. 10-2006-0111296.

Japanese Notice of Allowance issued by JPO, dated Jan. 25, 2011, corresponding to Japanese Patent Application No. 2007-109771, together with Request for Entry which was filed Apr. 25, 2011 in the Cross-Referenced U.S. Appl. No. 11/785,098.

European Examination Report issued by European Patent Office on Oct. 25, 2012 corresponding to European Patent Application No. 07252153.7. (Cited in Applicants' cross-referenced U.S. Appl. No. 13/408,919).

Japanese Office Action issued on Jul. 2, 2013 in the corresponding Japanese Patent Application No. 2011-123294.

* cited by examiner

ORGANIC LIGHT EMITTING DISPLAY AND FABRICATION METHOD THEREOF

CLAIM OF PRIORITY

This application makes reference to, incorporates the same herein, and claims all benefits accruing under 35 U.S.C. §119 from an application for ORGANIC LIGHT EMITTING DISPLAY AND FABRICATING METHOD THEREOF earlier filed in the Korean Intellectual Property Office on the 10 Nov. 2006 and there duly assigned Serial No. 10-2006-0111298.

BACKGROUND OF THE INVENTION

1. Field of the Invention

The present invention relates to an organic light emitting display and fabrication method thereof, and more particularly, the present invention relates to an organic light emitting display and fabrication method thereof in which UV-rays are prevented from impinging upon organic light emitting diodes through a substrate during or after fabricating processes, bending or damage is prevented, and fabrication process time is shortened.

2. Description of the Related Art

In general, an organic light emitting display is a self-emissive display device that emits light when electrons and holes are joined by supplying a current to a fluorescent or phosphorescent organic compound. An image is displayed by voltage driving or current writing n×m organic light emitting diodes.

Figure 1:
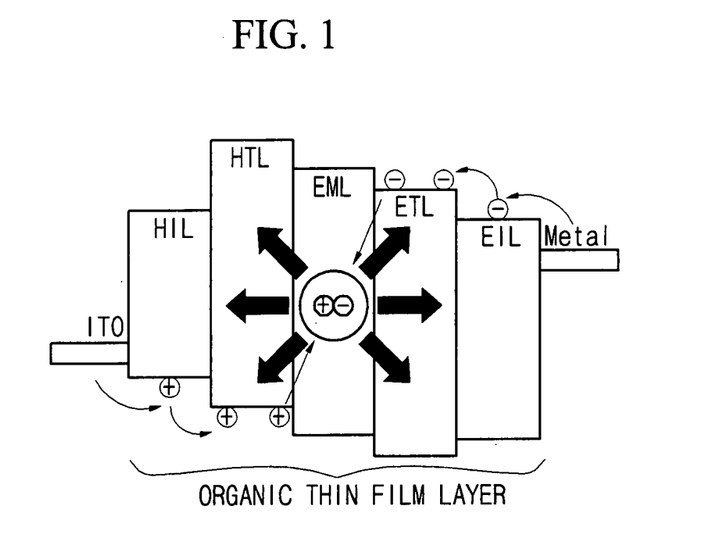
FIG. 1 is a schematic view of an organic light emitting diode.

Such an organic light emitting display, as shown in FIG. 1, includes an anode (ITO: Indium Tin Oxide), an organic thin film and a cathode electrode (metal). The organic thin film is composed of an EMitting Layer (EML) that emits light by generating an exciton as the electrons and holes are joined, an Electron Transport Layer (ETL) that controls the moving speed of the electrons, and a Hole Transport Layer (HTL) that controls the moving speed of the holes. Furthermore, an Electron Injecting Layer (EIL) may be formed in the ETL, and a Hole Injecting Layer (HIL) may be formed in the HTL.

Such an organic light emitting display is well used as a moving picture display device because of it's advantages in terms of wide viewing angles, fast response times, self light emission, and low power consumption, and can be fabricated to be light and thin. Also, the organic light emitting display can be fabricated at a low temperature, and can be fabricated at a low cost because of simple fabricating processes. Furthermore, it is expected that the organic light emitting display will replace conventional flat display devices, since organic light emitting material technology and process technology have been increasingly developed.

An organic light emitting display is required for thicknesses of 1 mm or below, since electronic appliances, such as cellular telephones, Personal Digital Assistants (PDAs), notebook computers, computer monitors and television sets are increasingly being made in a thin and compact size. However, protective film technology capable of replacing encapsulation technology has not been developed well enough, and thus, it is difficult to fabricate an organic light emitting display having thickness of 1 mm or below.

Therefore, for fabricating the organic light emitting display having thickness of 1 mm or below, a method of fabricating a slim organic light emitting display by respectively forming diode layers (a semiconductor layer and organic light emitting diode, etc.) on two glass substrates, bonding the glass substrates so that the respective diode layers face each other, and removing a surface of the glass substrate without the diode layer by means of an etching or grinding process is described in Japanese Patent Nos. JP 2005-340182, JP 2005-222930 and JP 2005-222789.

However, there is a problem in this method in that the fabricating process time is prolonged, because the semiconductor layers or the organic light emitting diodes are respectively formed on the glass substrates, and then an etching or grinding process is executed. Furthermore, the production yield is low because the glass substrate, semiconductor layer and organic light emitting diode are often damaged or broken during the bonding process, and thus the fabrication cost is high.

Of course, the glass substrate having a thickness of 1 mm or below can be fabricated and then the diode layer formed on the surface of the glass substrate. However, there is a problem in that the thickness of the glass substrate is too thin, and thus, the glass substrate is bent or broken by mechanical contact with the fabricating machine during the fabrication process.

SUMMARY OF THE INVENTION

The present invention has been developed to overcome the foregoing problems, and it is an object of the present invention to provide a thin organic light emitting display and fabrication method thereof.

It is another object of the present invention to provide an organic light emitting display which prevents UV-rays from impinging upon organic light emitting diodes through a substrate during or after a fabrication process.

It is still another object of the present invention to prevent a substrate from being bent or broken during the fabrication process.

It is still another object of the present invention to increase productivity as well as to reduce the cost by shortening the fabrication processing time.

To achieve the above described objects, an organic light emitting display is provided including: a substrate; an organic light emitting diode, an insulating layer and a semiconductor layer arranged on the substrate, the insulating layer being arranged between the organic light emitting diode and the semiconductor layer; and a non-transmissive layer arranged on the insulating layer, the non-transmissive layer being arranged between the insulating layer and the organic light emitting diode and blocking UV-rays.

The organic light emitting display preferably further includes: a buffer layer arranged on the substrate; a gate insulating layer arranged on the semiconductor layer; a gate electrode arranged on the gate insulating layer; an inter-layer dielectric layer arranged on the gate electrode; and a source/drain electrode arranged on the inter-layer dielectric layer, wherein the insulating layer is arranged between the source/drain electrode and the organic light emitting diode.

The non-transmissive layer is preferably arranged on an outer periphery of the organic light emitting diode. The non-transmissive layer is preferably arranged on an outer periphery of the organic light emitting diode on an upper surface of the insulating layer corresponding to the semiconductor layer. The non-transmissive layer is preferably arranged on an outer periphery of the organic light emitting diode on an upper surface of the insulating layer not corresponding to the semiconductor layer. The non-transmissive layer is preferably connected to an anode of the organic light emitting diode.

The organic light emitting display preferably further includes a pixel defining film arranged on the non-transmissive layer. The non-transmissive layer is preferably a UV-ray protective agent. The non-transmissive layer preferably includes at least one of a metal through which UV-rays cannot be transmitted, a transparent UV-ray protective agent or an opaque UV-ray protective agent. The non-transmissive layer preferably includes at least one of Cr, $Cr_2O_3$, Al, Au, Ag, MgO or a silver alloy.

The non-transmissive layer preferably has a thickness in a range of 500 Angstrom (Å) to 3000 Angstrom (Å). The non-transmissive layer preferably includes the same material as an anode of the organic light emitting diode. The non-transmissive layer preferably includes at least one of Indium Tin Oxide (ITO)/Ag, ITO/Ag/ITO or ITO/Ag/Indium Zinc Oxide (IZO).

The substrate preferably has a thickness in a range of 0.05 millimeters (mm) to 1 millimeters (mm). The substrate preferably includes one of a glass, plastic, steel or a polymer.

The organic light emitting display preferably further includes an anti-friction layer arranged on a lower surface of the substrate.

The organic light emitting display preferably further includes an anti-friction layer arranged on a lower surface of the substrate, the anti-friction layer having a thickness in a range of 10 micro-meters (μm) to 100 micro-meters (μm).

The organic light emitting display preferably further includes an anti-friction layer arranged on a lower surface of the substrate, the anti-friction layer including one of an organic or an inorganic material.

The organic light emitting display preferably further includes an electrically conductive via to electrically couple the non-transmissive layer to the source/drain electrode.

To achieve the above described objects, a method of fabricating an organic light emitting display is provided, the method including: bonding two substrates together; respectively forming a buffer layer on opposite surfaces to bonding surfaces of the respective substrates; respectively forming a semiconductor layer on the buffer layers; respectively forming an insulation layer on the semiconductor layers; respectively forming an non-transmissive layer on the insulation layers; respectively forming an organic light emitting diode on the non-transmissive layers; and separating the two bonded substrates.

Respectively forming the non-transmissive layer preferably includes applying the non-transmissive layer on the entire area of the respective insulating layer.

Forming the organic light emitting diode preferably includes forming a partial area of the non-transmissive layer into an anode.

Forming the non-transmissive layer preferably includes forming the non-transmissive layer of a UV-ray protective agent.

Forming the non-transmissive layer preferably includes forming the non-transmissive layer of at least one material selected from a metal, a transparent UV-ray protective agent or an opaque UV-ray protective agent.

Forming the non-transmissive layer preferably includes forming the non-transmissive layer of at least one material selected from Cr, $Cr_2O_3$, Al, Au, Ag, MgO or a silver alloy.

Forming the non-transmissive layer preferably includes forming the non-transmissive layer of at least one material selected from Indium Tin Oxide (ITO)/Ag, ITO/Ag/ITO and ITO/Ag/Indium Zinc Oxide (IZO).

The substrates are preferably formed to have a thickness in a range of 0.05 mm to 1 mm.

Bonding the substrates preferably includes forming an anti-friction layer between the substrates.

The method preferably further includes removing the anti-friction layer after separating the substrates.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Hereinafter, the present invention is described more specifically below with reference to the accompanying drawings so that a person ordinarily skilled in the art will understand the present invention without difficulty.

Figure 2:
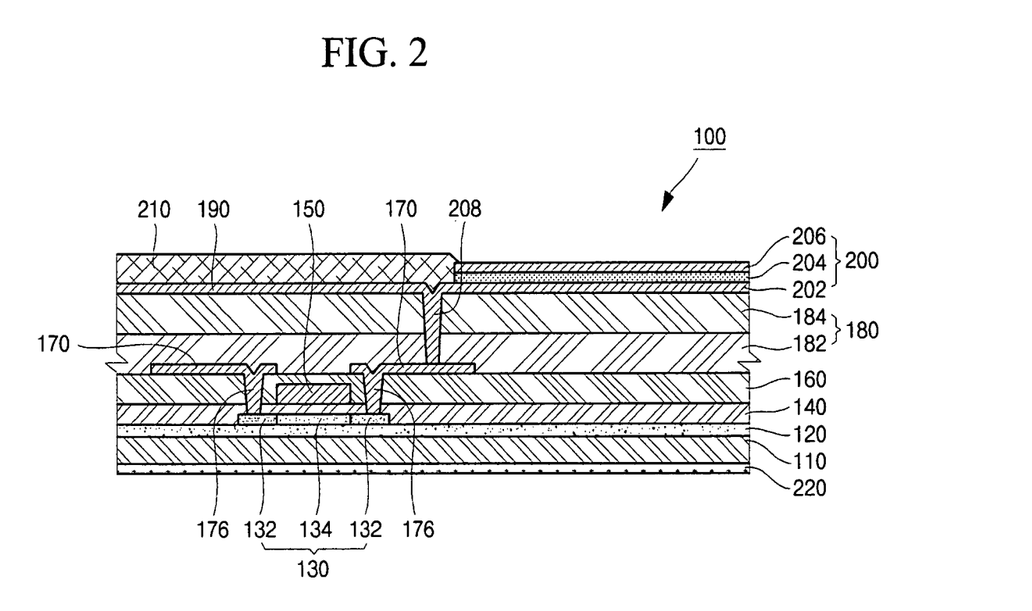
FIG. 2 is a cross-sectional view of an organic light emitting diode in accordance with an embodiment of the present invention.

Referring FIG. 2, a cross-sectional view of an organic light emitting diode in accordance with an embodiment of the present invention.

As shown in FIG. 2, an organic light emitting display 100 includes a substrate 110, a buffer layer 120 arranged on the substrate 110, a semiconductor layer 130 arranged on the buffer layer 120, a gate insulating layer 140 arranged on the semiconductor layer 130, a gate electrode 150 arranged on the gate insulating layer 140, an inter-layer dielectric layer 160 arranged on the gate electrode 150, a source/drain electrode 170 arranged on the inter-layer dielectric layer 160, an insulating layer 180 arranged on the source/drain electrode 170, an non-transmissive layer 190 arranged on the insulating layer 180, an organic light emitting diode 200 arranged on the non-transmissive layer 190, a pixel defining film 210 arranged on the non-transmissive layer 190 which is an outer periphery of the organic light emitting diode 200, and an anti-friction layer 220 arranged on the lower surface of the substrate 110.

The upper surface and the lower surface of the substrate 110 are parallel to each other, and a thickness between the upper and lower surfaces is formed to be 0.05 millimeters (mm) to 1 millimeters (mm). If the thickness is below 0.05 mm, the substrate is easily damaged by cleaning, etching and heat treatment process, and is weak with respect to external forces. If the thickness is above 1 mm, it is impossible to apply the substrate to various thin display devices. The substrate is formed of a material selected from a typical glass, plastic, polymer or an equivalent thereof. However, the present invention is not restricted to these materials.

The buffer layer 120 is formed on the upper surface of the substrate 110. This buffer layer 120 prevents $H_2O$, $H_2$ or $H_2$, etc from infiltrating into the semiconductor layer 130 or the organic light emitting diode 200 through the substrate 110. For this purpose, the buffer layer 120 is made of at least one material selected from $SiO_2$, $Si_3N_4$, inorganic film or an equivalent thereof. However, the present invention is not restricted to these materials. This buffer layer 120 may be omitted, if necessary.

The semiconductor layer 130 is formed on the upper surface of the buffer layer 120. This semiconductor layer 130 is composed of source/drain regions 132 formed on both sides opposite to each other, and a channel region 134 formed between the source/drain regions 132. For example, the semiconductor layer 130 may be a Thin Film Transistor (TFT). This TFT is at least one TFT selected from an amorphous Si TFT, poly Si TFT, organic TFT, micro Si TFT (with a grain size from the amorphous Si to the poly Si) or an equivalent thereof. However, the present invention is not restricted to these TFTs. Also, if the TFT is the poly Si TFT, the poly Si TFT may be formed by at least one method selected from a crystallization method using a laser at low temperature, a crystallization method using a metal, a crystallization method using high pressure, or the equivalent thereof. However, the present invention is not restricted to these methods. The crystallization method using a laser may be Excimer Laser Annealing (ELA), Sequential Lateral Solidification (SLS), Thin Beam Direction Crystallization (TDX) and so on. However, the present invention is not restricted to these methods. Also, the crystallization method using a metal may be Solid Phases Crystallization (SPC), Metal Induced Crystallization (MIC), Metal Induced Lateral Crystallization (MILC), Super Grained Silicon (SGS) and so on. However, the present invention is not restricted to these methods. Of course, the thin film resistor may be one of PMOS, NMOS or an equivalent thereof. However, the present invention is not restricted thereto.

The gate insulating layer 140 may be formed on the upper surface of the semiconductor layer 130. The gate insulating layer 140 may also be formed on the buffer layer 120 which is the outer periphery of the semiconductor layer 130. The gate insulating layer 140 is formed of at least one of a silicon oxide film, a silicon nitride film, an inorganic film or an equivalent thereof. However, the present invention is not restricted to these materials.

The gate electrode 150 is formed on the upper surface of the gate insulating layer 140. More specifically, the gate electrode 150 is formed on the gate insulating layer 140 corresponding to the channel region 134 of the semiconductor layer 130. As known to those skilled in the art, this gate electrode 150 makes holes or channels of an electron in the channel region 134 by applying an electric field to the channel region 134 of the gate insulating layer 140. The gate electrode 150 is formed of a typical metal (Mo, MoW, Ti, Cu, Al, AlNd, Cr, Mo alloy, Cu alloy, Al alloy, etc.), a doped poly silicon or an equivalent thereof. However, the present invention is not restricted to these materials.

The inter-layer dielectric layer 160 is formed on the upper surface of the gate electrode 150 and gate insulating layer 140. The inter-layer dielectric layer 160 is formed of at least one of a silicon oxide film, a silicon nitride film, a polymer, a plastic, a glass or an equivalent thereof. However, the present invention is not restricted to these materials.

The source/drain electrode 170 is formed on the upper surface of the inter-layer dielectric layer 160. An electrically conductive contact 176, which perforates the inter-layer dielectric layer 160, is formed between the source/drain electrode 170 and the semiconductor layer 130. That is, the source/drain regions 132 of the semiconductor layer 130 and the source/drain electrode 170 are electrically coupled by the electrically conductive contact 176. The source/drain electrode 170 is formed of the same metal material as the gate electrode 150. However, the present invention is not restricted to this material. The above-described semiconductor layer 130 (that is, the TFT) may be defined as a coplanar structure. However, the semiconductor layer 130 in accordance with an embodiment of the present invention is not restricted to the coplanar structure, and may have a different structure, for example, may be at least one of an inverted coplanar structure, a staggered structure, an inverted staggered structure or an equivalent thereof. However, the semiconductor layer 130 of the present invention is not restricted thereto.

The insulating layer 180 is formed on the upper surface of the source/drain electrode 170 and the inter-layer dielectric layer 160. This insulating layer 180 is composed of a protective film 182 and an overcoat film 184. The protective film 182 covers the source/drain electrode 170 and the inter-layer dielectric layer 160, and protects the source/drain electrode 170 and so on. This protective film 182 is formed of one material selected from a typical inorganic film or an equivalent thereof. However, the material of the protective film 182 of the present invention is not restricted thereto. Furthermore, the overcoat film 184 covers the protective film 182. This overcoat film 184 makes the whole surface of the diode flat, and is formed of at least one material selected from a Benzo Cyclo Butene (BCB), an Acrylic or an equivalent thereof. However, the present invention is not restricted to these materials.

The non-transmissive layer 190 is formed on the entire upper surface of the insulating layer 180. That is, the non-transmissive layer 190 is formed on the upper surface corresponding to the semiconductor layer 130 and on the upper surface not corresponding to the semiconductor layer 130. The non-transmissive layer 190 is electrically coupled to the source/drain electrode 170 through the electrically conductive via 208 perforating the insulating layer 180. The reason why the non-transmissive layer 190 is electrically coupled to the source/drain electrode 170 is described later.

The non-transmissive layer 190 prevents external UV-rays from infiltrating into the other substrate opposite to the UV-rays during the fabrication process which forms the organic light emitting diode 200 by bonding two substrates 110. The non-transmissive layer 190 prevents external UV-rays from infiltrating into the organic light emitting diode 200 after the substrate 110 is divided into pieces.

The non-transmissive layer 190 is formed of one material selected from a UV-ray protective agent or the equivalent. Furthermore, the non-transmissive layer 190 may be formed of at least one material selected from a metal through which UV-rays cannot be transmitted, a transparent UV-ray protective agent and an opaque UV-ray protective agent. Furthermore, if the non-transmissive layer 190 is the metal, then the non-transmissive layer is formed of at least one material selected from Cr, $Cr_2O_3$, Al, Au, Ag, MgO, silver alloy or an equivalent thereof. However, the present invention is not restricted to these materials.

The non-transmissive layer 190 is formed to have a thickness of 500 Angstrom (Å) to 3000 Angstrom (Å). If the thickness of the non-transmissive layer 190 is below 500 Å, then the elimination rate of UV-rays is low, and the semiconductor layer 130 or the organic light emitting diode 200 is affected by the radiation during or after the fabrication process. If the thickness of the non-transmissive layer 190 is above 3000 Å, then the elimination rate of UV-rays is good but the non-transmissive layer 190 is too thick.

The organic light emitting diode 200 is formed only on the certain region of the non-transmissive layer 190. This organic light emitting diode 200 includes an anode 202, an organic light emitting thin film 204 formed on the upper surface of the anode 202, and a cathode 206 formed on the upper surface of the organic light emitting thin film 204. The anode 202 is formed of at least one of ITO (Indium Tin Oxide)/Ag, ITO/Ag/ITO, ITO/Ag/IZO (Indium Zinc Oxide) or an equivalent thereof. However, the present invention is not restricted to these materials. The ITO is a transparent electrically conductive film which a hole injection barrier to the organic light emitting thin film 204 is small due to a constant work function, and said Ag is a film which reflects the light of the organic light emitting thin film 204 into the upper surface. The organic light emitting thin film 204 is composed of an EMitting Layer (EML) which is emitted as the exciton is formed by joining the electrons and holes, an Electron Transport Layer (ETL) which controls the speed of electrons appropriately, and a Hole Transport Layer (HTL) which controls the speed of holes appropriately. An Electron Injection Layer (EIL) is further formed on the electron transport layer, and a Hole Injection Layer (HIL) is further formed on the hole transport layer. Furthermore, the cathode 206 is at least one of Al, MgAg alloy, MgCa alloy or an equivalent thereof. However, the present invention is not restricted to these materials. However, if the front-emitting display is selected in the present invention, then the Al should be thin, and the resistance is increased, and thus the electron injection barrier is increased. The MgAg alloy has a lower electron injection barrier than that of the Al, and the MgCa alloy has a lower electron injection barrier than that of the MgAg. Therefore, in case of the front-emitting display, it is preferable that the MgAg alloy and the MgCa alloy are used as the cathode 206. However, the MgAg alloy and the MgCa alloy are sensitive to external environment and form an insulating layer by oxidation, and thus, perfect sealing is needed.

The anode 202 of the organic light emitting diode 200, and the non-transmissive layer 190 are of substantially the same material. That is, the non-transmissive layer 190 is formed on the entire upper surface of the insulating layer, and the region of the non-transmissive layer 190 in which the organic light emitting diode 200 is formed, is referred to as the anode 202. Therefore, the non-transmissive layer 190 is formed of at least one material selected from ITO, ITO/Ag, ITO/Ag/ITO, ITO/Ag/IZO or an equivalent thereof as is the anode 202. Furthermore, as described above, the non-transmissive layer 190 is electrically coupled to the source/drain electrode 170 by the electrically conductive via 208, since part of the non-transmissive layer 190 is used as the anode 202 of the organic light emitting diode 200.

The present invention may be applied to both a bottom-emitting display which emits toward the bottom of the substrate 110, and a surface-emitting display which emits toward both surfaces of the substrate 110, although the present invention has been mainly explained with reference to the front-emitting display.

The pixel defining film 210, as an outer periphery of the organic light emitting diode 200, is formed on the upper surface of the non-transmissive layer 190. This pixel defining film 210 forms a clear boundary between a red organic light emitting diode, a green organic light emitting diode and a blue organic light emitting diode, and thus clearly defines the emitting boundary region between the pixels. The pixel defining film 210 is formed of at least one of polyimide or an equivalent thereof. However, the material of the pixel defining film 210 is not limited thereto.

In the organic light emitting display 100 in accordance with an embodiment of the present invention, the anti-friction layer 220 is formed on the lower surface of the substrate 110. This anti-friction layer 220 prevents two substrates 110 from contacting each other during the fabrication process which forms the semiconductor 130 and the organic light emitting diode 200 by bonding two substrates 110. Furthermore, this anti-friction layer 220 prevents the substrate from bending or breaking during the transport process, since a specific rigidity is obtained by thickening the overall thickness when the two substrates are bonded. This anti-friction layer 220 is formed of one material selected from an organic material, an inorganic material or an equivalent thereof. However, the material is not limited thereto. It is preferable that the anti-friction layer 220 is formed to have a thickness of 10 micro-meters ($\mu$m) to 100 micro-meters ($\mu$m). When the thickness of the anti-friction layer 220 is below 10 $\mu$m, the two substrates 110 may contact each other, and when the thickness of the anti-friction layer 220 is above 100 $\mu$m, then the overall thickness of the substrate 110 may be too great.

Figure 3:
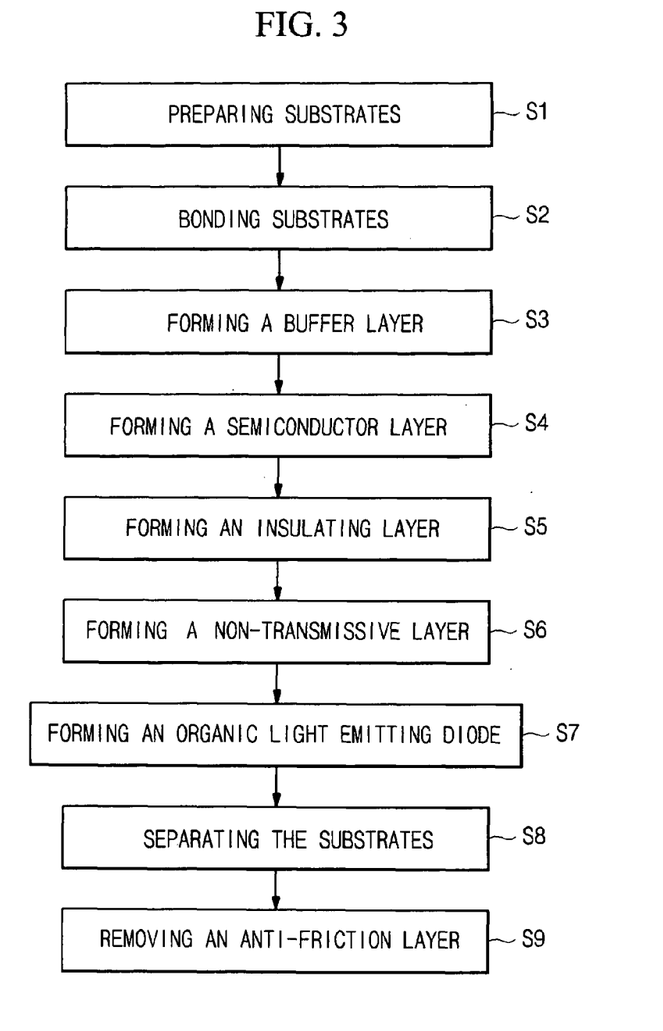
FIG. 3 is a flowchart of a method of fabricating an organic light emitting display in accordance with an embodiment of the present invention.

FIG. 3 is a flowchart of a method of fabricating an organic light emitting display in accordance with an embodiment of the present invention. As shown in FIG. 3, a method of fabricating an organic light emitting display in accordance with an embodiment of the present invention includes preparing substrates (S1), bonding the substrates (S2), forming a buffer layer (S3), forming a semiconductor layer (S4), forming an insulating layer (S5), forming an non-transmissive layer (S6), forming an organic light emitting diode (S7), separating the substrates (S8), and removing an anti-friction layer (S9).

FIGS. 4$a$ to 4$k$ are cross-sectional views of a method of fabricating an organic light emitting display in accordance with an embodiment of the present invention.

Figure 4A:
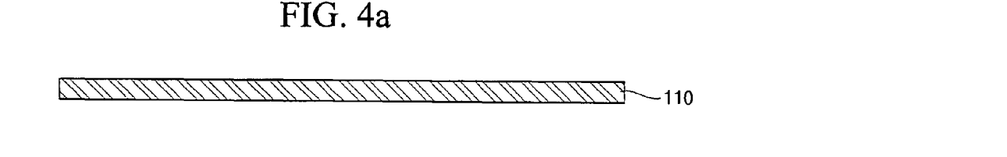
FIGS. 4a to 4k are cross-sectional views of a fabrication method steps of an organic light emitting display in accordance with an embodiment of the present invention.

First, substrates 110 having flat upper and lower surfaces and having a constant thickness are provided.

The substrates 110 are formed of one material selected from glass, plastic, steel or polymers. However, the material of the substrates 110 in accordance with an embodiment of the present invention is not limited thereto. It is preferable that the thickness of the substrates 110 is 0.05 mm to 1 mm. When the thickness is below 0.05 mm, the substrates are easily damaged by cleaning, etching and heat treatment process, and are weak with respect to external forces. When the thickness is above 1 mm, it is impossible to apply the substrates to various thin display devices.

As shown in FIG. 4$b$, in bonding the substrates (S2), two substrates 110 are prepared and bonded to each other.

Figure 4B:
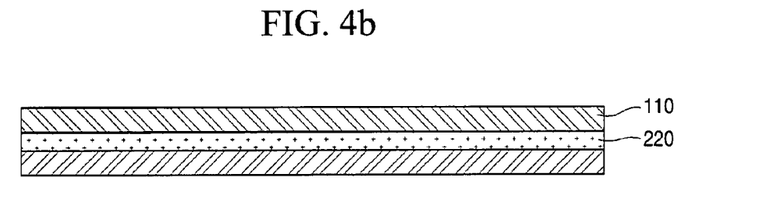

To avoid direct friction between two substrates 110 and to maintain a constant rigidity during fabricating process, an anti-friction layer 220 is provided between the two substrates 110. This anti-friction layer 220 is formed by depositing or coating at least one of an organic material, an inorganic material or an equivalent thereof. However, the material or the forming method of the anti-friction layer 220 is not restricted thereto. It is preferable that this anti-friction layer 220 is made of a material which is easily taken off, if the friction layer 220 is removed after completing the organic light emitting display. This material may be a photo resist of an organic material, for example. However, the material is not limited thereto. Furthermore, a bonding agent (not illustrated in drawings) is applied to a certain area or entire area of the substrates 110 to prevent the two substrates 110 from separating during the fabricating process. This bonding agent is at least one of a typical epoxy bonding agent, an UV-ray cured bonding agent or an equivalent thereof. However, the material is not limited thereto. The anti-friction layer 220 may be formed on the substrates 110 in advance, and the two anti-friction layers 220 then bonded to each other. However, the anti-friction layer 220 may be formed by injecting a liquid anti-friction layer 220 into the gap between the two substrates 110. That is, a liquid anti-friction layer 220 is injected into the gap between the two substrates 110, and flows into the gap with ease by a capillary action. It is preferable that the anti-friction layer 220 is cured by heat treating at a certain temperature after the liquid anti-friction layer 220 is formed.

Figure 4C:
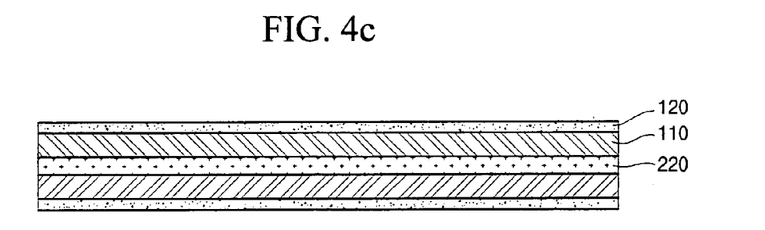

As shown in FIG. 4c, in step (S3) of forming the buffer layer 120, the buffer layer 120 having a constant thickness is formed on the surface of the substrates 110 which is opposite to the surface in which the anti-friction layer 220 is formed. This buffer layer 120 is formed of at least one of a silicon oxide film, a silicon nitride film or an equivalent thereof. However, the material of the buffer layer 120 is not limited thereto. The buffer layer 120 prevents $H_2O$, or $H_2$, and so on from infiltrating into the semiconductor layer 130 or the organic light emitting diode 200 through the substrate 110. The buffer layer 120 assists the semiconductor layer 130 and so on to be formed on the surface of the buffer layer 120.

Furthermore, the buffer layer 120 may be formed on one substrate 110 and then formed on the other substrate 110 in sequence, or the buffer layer may be formed on both substrates 110 simultaneously.

Figure 4D:
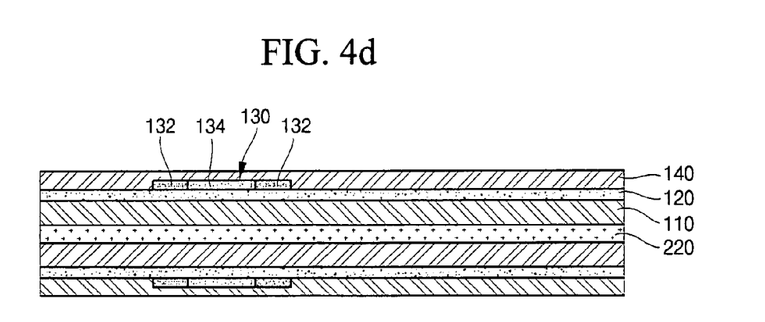

As shown in FIG. 4d, in step (S4) of forming the semiconductor layer 130, the semiconductor layer 130 is formed on the surface of the buffer layer 120, and the gate insulating layer 140 is formed thereon.

Forming the semiconductor layer 130 includes forming source/drain regions 132 on opposite sides thereof, and then forming a channel region 134 between the source/drain regions 132. For example, the semiconductor layer 130 is a TFT selected from at least one an amorphous Si TFT, poly Si TFT, organic TFT, micro Si TFT (with a grain size from the amorphous Si to the poly Si) or an equivalent thereof. However, the present invention is not limited to these TFTs.

Also, when the TFT is a poly Si TFT, the poly Si TFT is formed from at least one method selected from a crystallization method using a laser at low temperature, a crystallization method using a metal, a crystallization method using high pressure, or an equivalent thereof. However, the present invention is not limited to these methods.

The amorphous silicon is formed by at least one method selected from Plasma Enhanced Chemical Vapor Deposition (PECVD), Low Pressure Chemical Vapor Deposition (LPCVD), sputtering, or an equivalent thereof. However, the method of forming the amorphous silicon is not limited thereto. Furthermore, after the amorphous silicon is crystallized, a desired number of semiconductor layers 130 are formed in the desired position by means of photo resist, coating, exposure, development, etching, photo resist peeling and so on.

A method of crystallizing the amorphous silicon into poly silicon includes Excimer Laser Annealing (ELA), Sequential Lateral Solidification (SLS), Thin Beam Direction Crystallization (TDX) or an equivalent thereof. However, the method is not limited thereto. Also, a crystallization method using a metal includes Solid Phases Crystallization (SPC), Metal Induced Crystallization (MIC), Metal Induced Lateral Crystallization (MILC), Super Grained Silicon (SGS) or an equivalent thereof. However, the method is not limited thereto.

The thin film resistor may be one of PMOS, NMOS or an equivalent thereof. However, the electrically conductive type thereof is not limited thereto.

The gate insulating layer 140 having a constant thickness may be formed on the surface of the semiconductor layer 130 by at least one method selected from PECVD, LPCVD, sputtering or an equivalent thereof. However, the method is not limited thereto. The gate insulating layer 140 may also be formed on the buffer layer 120 which is an outer periphery of the semiconductor layer 130. The gate insulating layer 140 is formed of at least one of a silicon oxide film, a silicon nitride film, an inorganic film or an equivalent thereof. However, the material is not limited thereto.

Figure 4E:
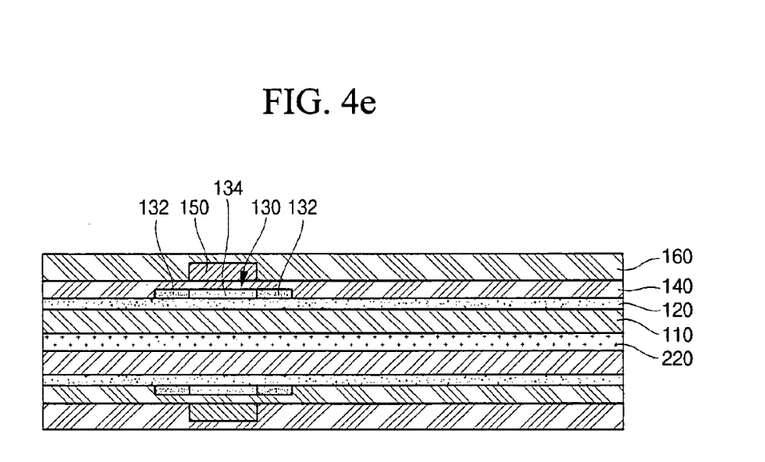

As shown in FIG. 4e, the gate electrode 150 is formed on the upper surface of the gate insulating layer 140 by a method selected from PECVD, LPCVD, sputtering or an equivalent thereof. A desired number of gate electrodes 150 is formed in the desired position by a photo resist, coating, exposure, development, etching, photo resist peeling and so on. The gate electrode 150 is formed on the gate insulating layer 140 corresponding to the channel region 134 of the semiconductor layer 130. The gate electrode 150 forms a channel of holes or electrons in the channel region 134 by applying an electric field on the channel region 134 of the lower part of the gate insulating layer 140. The gate electrode 150 is formed of a typical metal (Mo, MoW, Ti, Cu, Al, AlNd, Cr, Mo alloy, Cu alloy, Al alloy, and etc.), a doped poly silicon or an equivalent thereof. However, the material is not limited thereto.

The inter-layer dielectric layer 160 is formed on the upper surface of the gate electrode 150 and gate insulating layer 140. The inter-layer dielectric layer 160 is formed of at least one of a silicon oxide film, a silicon nitride film, a polymer, a plastic, a glass or an equivalent thereof. However, the material of the inter-layer dielectric layer 160 is not limited thereto. The region of the inter-layer dielectric layer 160 which corresponds to the source/drain region 132 is exposed to the outside by the etching process. The exposed region is referred to as a contact hole, and a contact is subsequently formed on the contact hole.

Figure 4F:
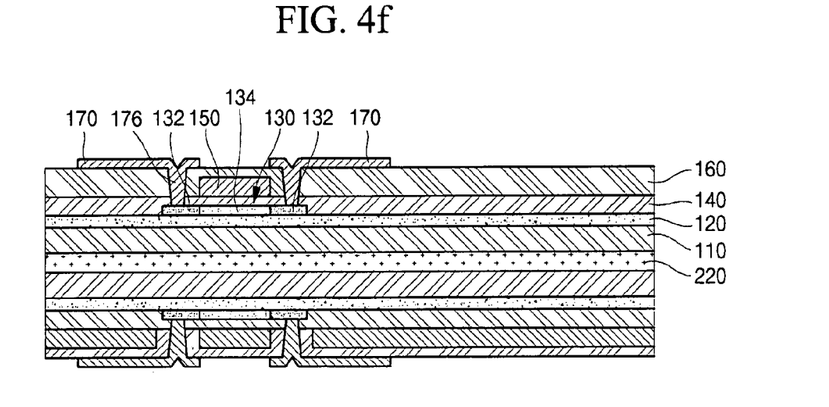

As shown in FIG. 4f, the source/drain electrode 170 is formed on the inter-layer dielectric layer by one method selected from PECVD, LPCVD, sputtering or an equivalent thereof. After the above described deposition process, a desired number of source/drain electrodes 170 is formed in the desired positions by a photo resist, coating, exposure, development, etching, photo resist peeling and so on. An electrically conductive contact 176 is formed between the source/drain electrode 170 and the source/drain regions 132 of the semiconductor layer 130. The electrically conductive contact 176 is formed by filling the preformed contact hole.

The semiconductor layer 130 and the source/drain electrode 170 are electrically coupled by the electrically conductive contact 176. The electrically conductive contact 176 is formed of the same material as the gate electrode 150 and the source/drain electrode 170. However, the material of the electrically conductive contact 176 is not limited thereto.

The source/drain electrode 170 is formed of the same metal material as the gate electrode 150. However, the material is not limited thereto. The above-described semiconductor layer 130 (that is, the TFT) is defined as a coplanar structure. The semiconductor layer 130 is not limited to the coplanar structure, and may be other structures known hereto, for example, at least one of an inverted coplanar structure, a staggered structure, an inverted staggered structure or an equivalent thereof. However, the semiconductor layer 130 is not limited thereto.

The semiconductor layer 130, the gate insulating layer 140, the gate electrode 150, the inter-layer dielectric layer 160 and the source/drain electrode 170 are formed on the substrate 110 of one side and then formed on the substrate 110 of the other side. That is, the semiconductor layer 130, the gate insulating layer 140, the gate electrode 150, the inter-layer dielectric layer 160 and the source/drain electrode 170 are completed on the one substrate 110, and the semiconductor layer 130, the gate insulating layer 140, the gate electrode 150, the inter-layer dielectric layer 160 and the source/drain electrode 170 are completed on the other substrate 110. Furthermore, the constituent diodes 130, 140, 150, 160, and 170 are formed in sequence by flipping one and the other substrates. Furthermore, the constituent diodes 130, 140, 150, 160, and 170 may be completed by forming them on both substrates, if the processing devices are sufficient.

Figure 4G:
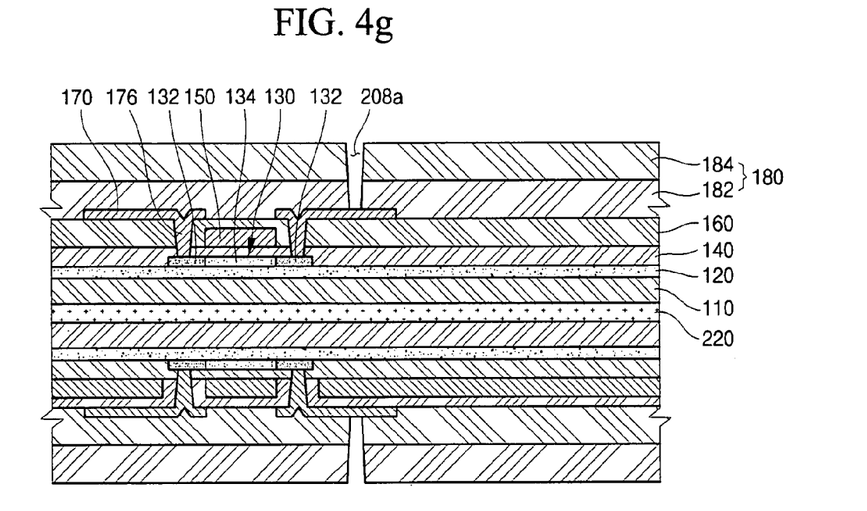

As shown in FIG. 4g, in step (S5), the insulating layer 180 having a constant thickness is formed on the semiconductor layer 130 (i.e. the upper surface of the source/drain electrode 170 and the inter-layer dielectric layer 160).

This insulating layer 180 is composed of a protective film 182 and an overcoat film 184. The protective film 182 covers the source/drain electrode 170 and the inter-layer dielectric layer 160, and protects the source/drain electrode 170, the gate electrode 150 and so on. The via hole 208a is formed in advance by etching the protective film 182 and the overcoat film 184 in the area which corresponds to the source/drain electrode 170. The protective film 182 is formed of one material selected from a typical inorganic film or an equivalent thereof. However, the material of the protective film 182 is not limited thereto. Furthermore, the overcoat film 184 covers the protective film 182. This overcoat film 184 makes the entire surface of the diode flat, and is formed of at least one material selected from a Benzo Cyclo Butene (BCB), an Acrylic or an equivalent thereof. However, the material is not limited thereto.

The insulating layer 180 is formed on one side of the substrate 110, and then formed on the other side of the substrate 110. That is, the insulating layer 180 is completed on the one substrate 110, and the insulating layer 180 is completed on the other substrate 110. Furthermore, the insulating layer 180 may be formed in sequence by flipping one and the other substrates. Furthermore, the insulating layer 180 may be formed them on both substrates, if the processing devices are sufficient.

Figure 4H:
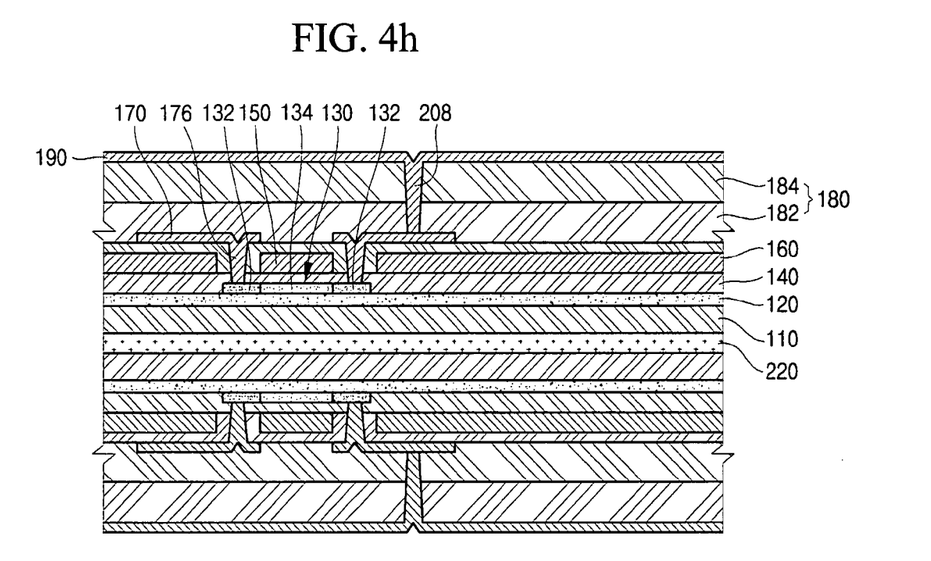

As shown in FIG. 4h, in step (S6), the non-transmissive layer 190 having a constant thickness is formed on the entire upper surface of the insulating layer 180. That is, the non-transmissive layer 190 is formed on the upper surface corresponding to the semiconductor layer 130 and on the upper surface not corresponding to the semiconductor layer 130. The non-transmissive layer 190 is electrically coupled to the source/drain electrode 170 through the electrically conductive via 208.

The non-transmissive layer 190 prevents UV-rays from infiltrating into other substrate opposite to the UV-rays during the fabricating process that forms the organic light emitting diode 200 by bonding two substrates 110. The non-transmissive layer 190 prevents external UV-rays from infiltrating into the organic light emitting diode 200 after the substrate 110 is divided into pieces.

The non-transmissive layer 190 is formed of a UV-ray protective agent or an equivalent. Furthermore, the non-transmissive layer 190 may be formed of at least one of a metal through which UV-ray cannot be transmitted, a transparent UV-ray protective agent or an opaque UV-ray protective agent. Furthermore, if the non-transmissive layer 190 is a metal, then the non-transmissive layer 190 is formed of at least one material selected from Cr, $Cr_2O_3$, Al, Au, Ag, MgO, a silver alloy or an equivalent thereof. However, the material is not limited thereto.

The non-transmissive layer 190 is formed to have a thickness of 500 Å to 3000 Å. If the thickness of the non-transmissive layer 190 is below 500 Å, then the elimination rate of UV-rays is low, and thus the semiconductor layer 130 or the organic light emitting diode 200 is affected by UV-rays during or after the fabrication process. If the thickness of the non-transmissive layer 190 is above 3000 Å, then the elimination rate of UV-rays is good. However, the non-transmissive layer 190 is too thick.

Furthermore, the non-transmissive layer 190 is formed by at least one method selected from Plasma Enhanced Chemical Vapor Deposition (PECVD), Low Pressure Chemical Vapor Deposition (LPCVD), sputtering or an equivalent thereof. However, the method of forming the non-transmissive layer 190 is not restricted thereto.

The non-transmissive layer 190 may be formed on one substrate 110, and then formed on the other substrate 110 in sequence, or may be formed on both substrates 110 simultaneously.

Figure 4I:
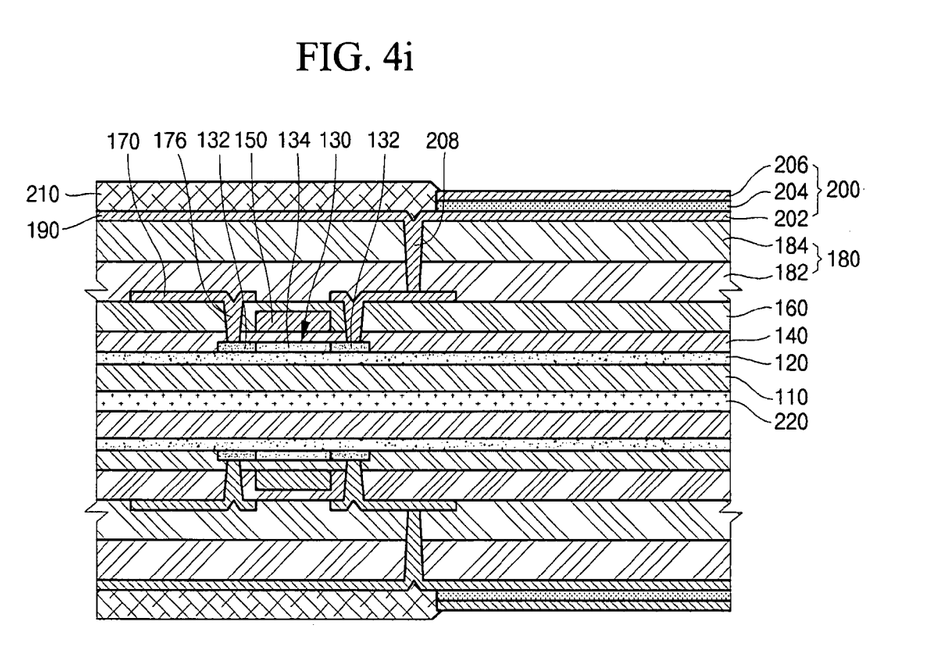

As shown in FIG. 4i, in step (S7), the organic light emitting diode 200 is formed on a certain area of the non-transmissive layer 190 as a thin film.

More specifically, a part of the non-transmissive layer 190 used as the anode 202, the organic light emitting thin film 204 and the cathode 206 are formed in sequence.

The anode 202 is formed of at least one material selected from ITO, ITO/Ag, ITO/Ag/ITO, ITO/Ag/IZO or an equivalent thereof. However, the material or the method of forming the anode 202 is not limited thereto. For example, the anode 202 is formed by one method of RF sputtering, DC sputtering, ion-beam sputtering or vacuum evaporation. After that, a desired area of the anode is formed in the desired position by a photo resist, coating, exposure, development, etching, photo resist peeling and so on. The anode 202 is electrically coupled to the source/drain electrode 170 through the electrically conductive via 208 perforating the insulating layer 180.

A region of the non-transmissive layer 190 is used as the anode of the organic light emitting diode 200. Therefore, the material of the non-transmissive layer 190 is substantially the same as that of the anode 202. That is, the non-transmissive layer 190 is formed of at least one of ITO/Ag, ITO/Ag/ITO, ITO/Ag/IZO or an equivalent thereof. Furthermore, the anode 202 is electrically coupled to the source/drain electrode 170 through the electrically conductive via 208 as described above, since the region of the non-transmissive layer 190 is used as the anode of the organic light emitting diode 200.

Furthermore, the ITO serves as a small transparent electrically conductive film having a low hole injection barrier against the organic light emitting thin film 204 due to a constant work function, said Ag reflects the light from the organic light emitting thin film 204 in the front-emitting display.

The organic light emitting thin film 204 is composed of at least one of a Hole Injecting Layer (HIL) that improves the injection efficiency of the hole, a Hole Transport Layer (HTL) that controls the moving speed of the hole appropriately, an EMitting Layer (EML) that emits light by forming an exciton, an Electron Transport Layer (ETL) that controls the moving speed of the electrons, or an Electron Injection Layer (EIL) that improves the injection efficiency of the electrons in sequence. However, the present invention is not limited thereto. For example, the organic light emitting thin film 204 may be formed by a wet coating method such as a spin coating that applies the thin film as a liquid, a deep coating, a spray method, a screen printing method, an ink-jet printing method and so on, or by a dry coating method such as sputtering, vacuum evaporation and so on.

The cathode 206 is formed on the Electron Injection Layer (EIL) of the organic light emitting thin film. The cathode 206 is formed by depositing at least one of Al, MgAg alloy, MgCa alloy or an equivalent. However, the material or the forming method is not limited thereto. For example, the cathode 206 may be formed by one of RF sputtering, DC sputtering, ion-beam sputtering or a vacuum evaporation method. After that, a desired area of the cathode 206 is formed in the desired position by a photo resist, coating, exposure, development, etching, photo resist peeling and so on.

Furthermore, if the front-emitting display is chosen and if Al is used as the cathode 206, then it must be very thin to increase its light emitting rate, and thus, the electron injection barrier may be increased as the resistance is increased. Therefore, at least one of an MgAg alloy, an MgCa alloy or an equivalent thereof may be used as the cathode 206. The cathode 206 may also be formed of one of ITO or IZO.

The MgAg alloy and the MgCa alloy are sensitive to external environment and form the insulating layer by oxidation, and thus, a perfect seal is required.

Furthermore, the pixel defining film 210 is formed on the non-transmissive layer 190 to clearly define the boundary between the organic light emitting diodes 200 after the cathode 206 is completed. This pixel defining film 210 is formed of at least one of a polyimide or an equivalent thereof. The organic light emitting diode 200 is exposed to the outside by a photo resist, coating, exposure, development, etching, photo resist peeling and so on after this coating or deposition is completed.

Furthermore, the present invention may be applied to both a bottom-emitting display which emits light toward the bottom of the substrate 110, and to a surface-emitting display which emits light toward both surfaces of the substrate 110. However, the present invention has been explained with reference to the front-emitting display.

The organic light emitting diode 200 is formed on one side of the substrate 110 and then formed on the other side of the substrate 110. That is, the organic light emitting diode 200 is first completed on one substrate 110, and the organic light emitting diode 200 is then completed on the other substrate 110. Furthermore, the organic light emitting diode 200 may be formed in sequence by flipping one and the other substrates 100. Furthermore, the organic light emitting diode 200 may be completed by being formed on both substrates 110, if the processing devices are sufficient.

Figure 4J:
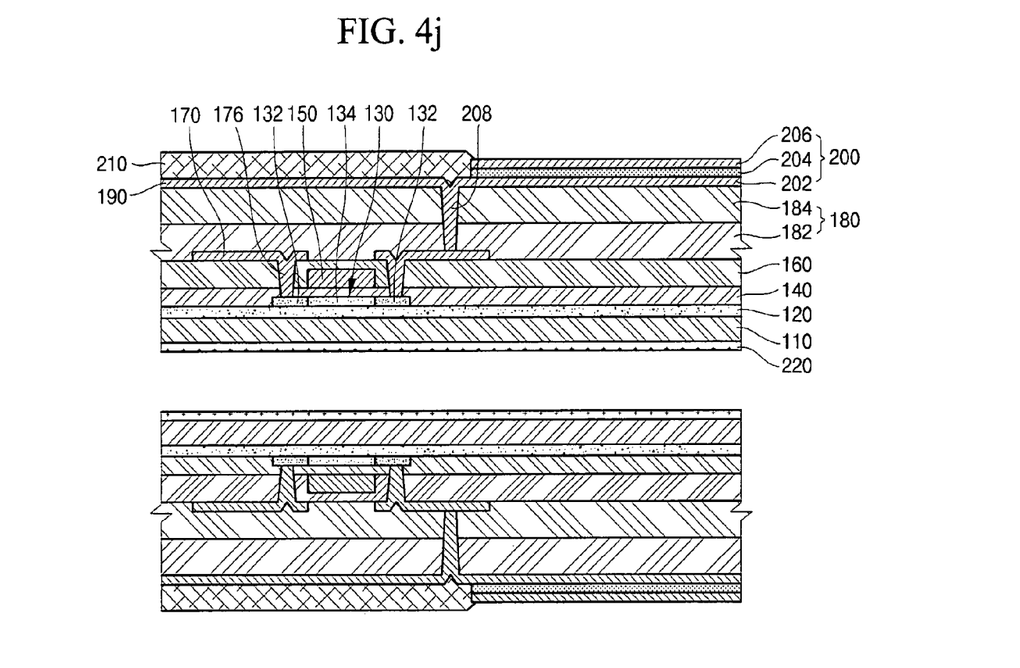

As shown in FIG. 4j, in step (S8), the respective substrates 110 are bonded and processed and then separated. That is, the bonding agent which bonds the two substrates 110 together is removed by a sawing tool, etc, to separate the respective substrates 110. If the anti-friction layer 220 is formed on the substrates 110, then the respective substrates 110 are separated with ease. However, if the bonding agent is applied to the respective substrates 110 and the anti-friction layer 220 in a liquid phase is injected into the gap between the substrates 110, then the respective substrates 110 are separated by a chemical solution which dissolves the anti-friction layer 220.

The anti-friction layer 220 may remain on one side of the substrate 110 after the substrates 110 are separated. Furthermore, while not illustrated in the drawings, a bonding process, which bonds an encapsulation substrate using an encapsulation material, may be further included. A transparent absorbent may be formed on the encapsulation substrate to absorb the moisture.

The present invention is completed with the separation of the substrates 110. That is, after the separation step, the display is marketed as the product, after a cell test, Flexible Printed Circuit (FPC) bonding, module test and reliability test have been completed. The cell test may be achieved by forming a region for the cell test on the substrate 110 before the sawing step.

If the separation step (S8) is chosen as the last process, the anti-friction layer 220 may remain on one side of the substrate 110 of the light emitting display device 100. This anti-friction layer 220 may prevent the UV-rays from infiltrating as well as protecting the surface of the substrate 110 from the external environment.

As described above, in the present invention, for example, the thickness of the substrate 110 is 0.5 mm, and is regarded as a bonded substrate having a thickness of 1 mm or more, since the fabrication process is accomplished by bonding two substrates together. Therefore, the bending or breaking phenomenon is prevented as the rigidity is increased, and the semiconductor layer forming process and the organic light emitting diode forming process are easily achieved. Once the product is completed, the substrates are separated into respective substrates, and thus it is possible to get a thin substrate having a thickness of 0.5 mm.

Figure 4K:
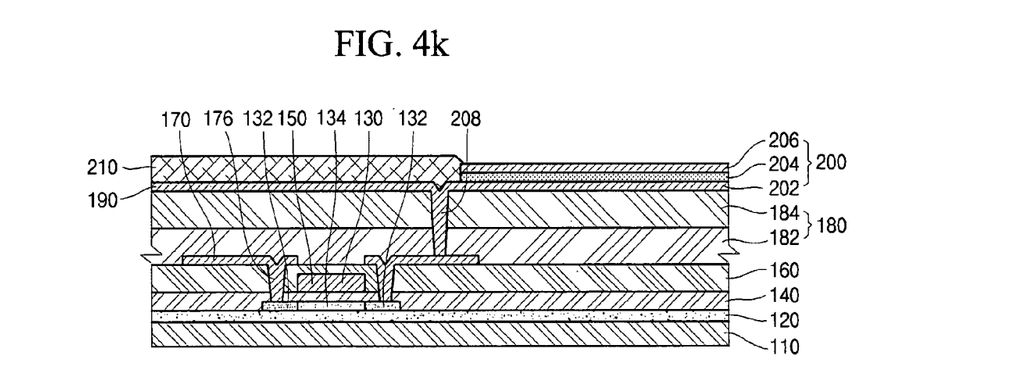

In the anti-friction layer removing step (S9) as shown in FIG. 4k, the anti-friction layer 220 formed on the substrate 110 is removed. That is, the anti-friction layer 220 is removed from the substrate 110 by using a specific chemical solution or by using a grinding machine. Therefore, if the anti-friction layer 220 is removed, no anti-friction layer 220 remains on the surface of the substrate 110 of the organic light emitting display, and the device is thin. Of course, the anti-friction layer 220 may remain for blocking UV-rays or for protecting against external impact. However, the non-transmissive layer 190 is already formed in the substrate 110, and thus the remaining of the anti-friction layer 220 is required.

Therefore, the organic light emitting display in accordance with an embodiment of the present invention is applied to electronic appliances, such as cellular telephones, Personal Digital Assistants (PDAs), notebook computers, computer monitors and television sets, so that they may be easily fabricated to be thin and compact by including a substrate with a thickness of 0.05 mm to 1 mm.

Also, the organic light emitting display in accordance with an embodiment of the present invention prevents UV-rays from influencing the organic light emitting diodes through the substrate during use by forming the non-transmissive layer in the lower part of the organic light emitting diodes.

Therefore, the method of fabricating the organic light emitting display in accordance with an embodiment of the present invention shortens the overall processing time by 50% as the semiconductor processing and the organic thin film processing (including cleaning, etching, exposure, development and heat treatment) are executed simultaneously by bonding two substrates having a thickness of 0.05 mm to 1 mm together.

Also, the method of fabrication in accordance with an embodiment of the present invention prevents UV-rays from infiltrating to the other substrate well enough during exposure processing by forming the non-transmissive layer in the lower part of the organic light emitting diode.

Also, the method of fabrication in accordance with an embodiment of the present invention prevents the substrate from bending or breaking during fabrication processes as rigidity is increased by forming the anti-friction layer having a specific thickness between the substrates to be bonded.

Also, the method of fabrication in accordance with an embodiment of the present invention prevents the substrates from contacting each other, and thus, from being damaged by forming the anti-friction layer between the substrates.

While the present invention is described herein with reference to illustrative embodiments for particular applications, it should be understood that the present invention is not limited thereto. Those having ordinary skill in the art will recognize additional modifications, applications, and embodiments within the scope thereof.

What is claimed is:

1. An organic light emitting display device, comprising:
a substrate;
an organic light emitting diode, an insulating layer and a semiconductor layer arranged on an upper surface of the substrate, the insulating layer being arranged between the organic light emitting diode and the semiconductor layer; and
a non-transmissive layer arranged over an entire major surface of the insulating layer and between the insulating layer and the organic light emitting diode to cover the entirety of the semiconductor layer and to carry electrical drive signals between the semiconductor layer and the organic light emitting diode to drive the device to display varying visual images, wherein
the non-transmissive layer being a part of the organic light emitting diode and blocking transmission of ultra-violet (UV)-rays; and
the insulating layer comprises a protective film formed of an inorganic material and an overcoat film formed of at least one material selected from a Benzo Cyclo Butene (BCB), an Acrylic, and the protective film is formed over the semiconductor layer and the overcoat film is formed on the protective film.

2. The organic light emitting display device as claimed in claim 1, further comprising:
a buffer layer arranged on the substrate;
a gate insulating layer arranged on the semiconductor layer;
a gate electrode arranged on the gate insulating layer;
an inter-layer dielectric layer arranged on the gate electrode; and
a source/drain electrode arranged on the inter-layer dielectric layer, wherein the insulating layer is arranged between the source/drain electrode and the organic light emitting diode.

3. The organic light emitting display device as claimed in claim 1, wherein the non-transmissive layer is arranged on an outer periphery of the organic light emitting diode.

4. The organic light emitting display device as claimed in claim 1, wherein the non-transmissive layer is arranged on an outer periphery of the organic light emitting diode on an upper surface of the insulating layer corresponding to the semiconductor layer.

5. The organic light emitting display device as claimed in claim 1, wherein the non-transmissive layer is connected to an anode of the organic light emitting diode.

6. The organic light emitting display device as claimed in claim 1, further comprising a pixel defining film arranged on the non-transmissive layer.

7. The organic light emitting display device as claimed in claim 1, wherein the non-transmissive layer is a UV-ray protective agent.

8. The organic light emitting display device as claimed in claim 1, wherein the non-transmissive layer comprises at least one of a metal through which UV-rays cannot be transmitted, a transparent UV-ray protective agent or an opaque UV-ray protective agent.

9. The organic light emitting display device as claimed in claim 1, wherein the non-transmissive layer comprises at least one of Cr, $Cr_2O_3$, Al, Au, Ag, MgO or a silver alloy.

10. The organic light emitting display device as claimed in claim 1, wherein the non-transmissive layer has a thickness in a range of 500 Angstrom (Å) to 3000 Angstrom (Å).

11. The organic light emitting display device as claimed in claim 1, wherein the non-transmissive layer comprises the same material as an anode of the organic light emitting diode.

12. The organic light emitting display device as claimed in claim 1, wherein the non-transmissive layer comprises at least one of Indium Tin Oxide (ITO)/Ag, ITO/Ag/ITO or ITO/Ag/Indium Zinc Oxide (IZO).

13. The organic light emitting display device as claimed in claim 1, wherein the substrate has a thickness in a range of 0.05 millimeters (mm) to 1 millimeter (mm).

14. The organic light emitting display device as claimed in claim 1, further comprising an anti-friction layer arranged on a lower surface of the substrate.

15. The organic light emitting display device as claimed in claim 14, wherein the anti-friction layer has a thickness in a range of 10 micro-meters (μm) to 100 micro-meters (μm).

16. The organic light emitting display device as claimed in claim 14, the anti-friction layer including one of an organic and an inorganic material.

17. The organic light emitting display device as claimed in claim 1, further comprising an electrically conductive via to electrically couple the non-transmissive layer to the source/drain electrode.

18. An organic light emitting display device, comprising:
a substrate;
a thin film transistor (TFT) formed on the substrate;
an insulation layer formed on the thin film transistor;
an electrically conducting, non-transmissive layer formed on the insulation layer;
an organic light emitting diode formed on the certain region of the non-transmissive layer to respond to electrical signals received via the non-transmissive layer from the thin film transistor, by emitting light representative of the electrical signals received; and wherein
the non-transmissive layer extending across an outer periphery of the organic light emitting diode and across a major surface of the insulating layer corresponding to the thin film transistor, and the non-transmissive layer is part of the organic light emitting diode, and
the insulating layer comprises a protective film formed of an inorganic material and an overcoat film formed of at least one material selected from a Benzo Cyclo Butene (BCB), an Acrylic, and the protective film is formed on the thin film transistor and the overcoat film is formed on the protective film.

19. The organic light emitting display device as claimed in claim 1, wherein the substrate comprises one of a glass, plastic, steel or a polymer.

20. An organic light emitting display device, comprising:
a substrate;
a buffer layer formed on one surface of the substrate;
a semiconductor layer formed on the buffer layer;
an insulation layer formed on the semiconductor layer;
an electrically conductive non-transmissive layer formed on the insulating layer with a first portion corresponding to and covering the entirety of the semiconductor layer; and with a second portion extending beyond the first portions and
an organic light emitting diode formed on the second portion of the non-transmissive layer to respond to electrical signals received via the non-transmissive layer from the semiconductor layer, by emitting light representative of the electrical signals received, wherein
the insulating layer comprises a protective film formed of an inorganic material and an overcoat film formed of at least one material selected from a Benzo Cyclo Butene (BCB), an Acrylic, and the protective film is formed on the semiconductor layer and the overcoat film is formed on the protective film.

21. The display device of claim 20, wherein the non-transmissive layer comprises the non-transmissive layer covering the entire area of the respective insulating layer.

22. The display device of claim 20, wherein the organic light emitting diode comprises an anode corresponding to a particular area of the non-transmissive layer.

23. The display device of claim 20, wherein the non-transmissive layer comprises a UV-ray protective agent.

24. The display device of claim 20, wherein the non-transmissive layer comprises at least one material selected from a metal, a transparent UV-ray protective agent or an opaque UV-ray protective agent.

25. The display device of claim 20, wherein the non-transmissive layer comprises of at least one material selected from Cr, $Cr_2O_3$, Al, Au, Ag, MgO or a silver alloy.

26. The display device of claim 20, wherein the non-transmissive layer comprises at least one material selected from Indium Tin Oxide (ITO)/Ag, ITO/Ag/ITO and ITO/Ag/Indium Zinc Oxide (IZO).

27. The display device of claim 20, wherein the substrates has a thickness in a range of 0.05 millimeters (mm) to 1 millimeter (mm).

* * * * *